(12) United States Patent
Kikuchi et al.

(10) Patent No.: US 10,877,662 B2
(45) Date of Patent: Dec. 29, 2020

(54) INPUT DEVICE

(71) Applicant: FUJITSU COMPONENT LIMITED, Tokyo (JP)

(72) Inventors: Maiko Kikuchi, Tokyo (JP); Akio Nakamura, Tokyo (JP); Katsuya Funakoshi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 16/357,675

(22) Filed: Mar. 19, 2019

(65) Prior Publication Data
US 2019/0303001 A1 Oct. 3, 2019

(30) Foreign Application Priority Data
Apr. 3, 2018 (JP) .................. 2018-071535

(51) Int. Cl.
G06F 3/041 (2006.01)
G06F 3/0488 (2013.01)
G06F 3/01 (2006.01)
F21V 8/00 (2006.01)
G02B 30/27 (2020.01)
G02B 30/56 (2020.01)

(52) U.S. Cl.
CPC .......... *G06F 3/04886* (2013.01); *G02B 6/005* (2013.01); *G02B 30/27* (2020.01); *G02B 30/56* (2020.01); *G06F 3/016* (2013.01); *G06F 2203/04809* (2013.01)

(58) Field of Classification Search
CPC .... G06F 3/04886; G06F 3/0233; G06F 3/041; G06F 3/02; G06F 3/016; G06F 2203/04809; G06F 3/03547; G02B 30/27; G02B 30/56; G02B 6/005; G02B 27/2214
See application file for complete search history.

(56) References Cited

U.S. PATENT DOCUMENTS

| 2012/0103778 | A1 | 5/2012 | Obata et al. |
| 2014/0268876 | A1 | 9/2014 | Lee et al. |
| 2015/0185847 | A1 | 7/2015 | Shirai |
| 2017/0025097 | A1* | 1/2017 | Kuribayashi ........... G06F 3/147 |

FOREIGN PATENT DOCUMENTS

| JP | 2012-108864 | 6/2012 |
| JP | 2015-125666 | 7/2015 |
| KR | 10-2011-0053010 | 6/2011 |
| KR | 10-2013-0043750 | 5/2013 |

OTHER PUBLICATIONS

Japanese Platform for Patent Information English abstract for Japanese Patent Publication No. 2012-108864, published Jun. 7, 2012.
Japanese Platform for Patent Information English abstract for Japanese Patent Publication No. 2015-125666, published Jul. 6, 2015.
Notification of Reason for Refusal, dated Mar. 16, 2020, in corresponding Korean Application No. 10-2019-0038210 (7 pp.).

* cited by examiner

Primary Examiner — Adam R. Giesy
(74) Attorney, Agent, or Firm — Staas & Halsey LLP

(57) ABSTRACT

An input device includes: a printing layer on which an image of a key including a character is printed; a 3D lens that three-dimensionally floats the image of the key printed on the printing layer; and an input detector that detects an input in accordance with the depression of the image of the key floating three-dimensionally.

6 Claims, 7 Drawing Sheets

FIG. 2A
FIG. 2B
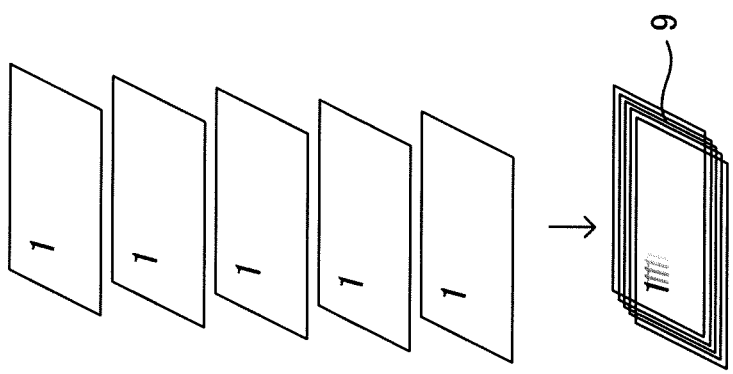
FIG. 2C
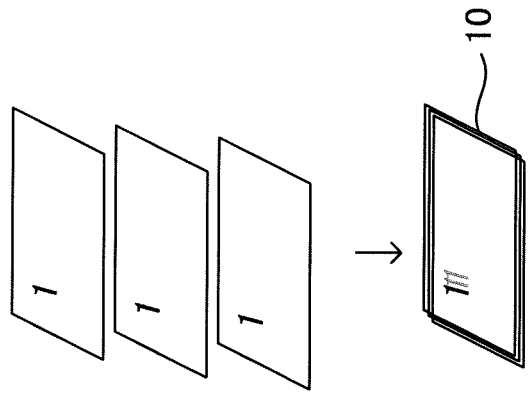

INPUT DEVICE

CROSS-REFERENCE TO RELATED APPLICATION

This application is based upon and claims the benefit of priority of the prior Japanese Patent Application No. 2018-071535 filed on Apr. 3, 2018, the entire contents of which are incorporated herein by reference.

FIELD

A certain aspect of the embodiments is related to an input device.

BACKGROUND

A software keyboard of a tablet or a mobile phone detects an input through a touch panel having a flat surface and inputs key data corresponding to an input position, unlike a mechanical key. When the touch input of the flat screen is performed, there is no depression feeling of each key. Therefore, the software keyboard has a feature that the touch mistake easily occurs, and a feature that is not suitable for long-term use, compared to a normal keyboard.

There has been known an input device that includes an electrostatic capacitance type touch panel, a film having printed characters and printed symbols, and a backlight for illuminating the film (e.g. see Japanese Laid-open Patent Publication No. 2012-108864). In addition, there has been known a display input device that can inform a user of an operation feeling of the touch panel effectively by using a piezoelectric element (e.g. see Japanese Laid-open Patent Publication No. 2015-125666).

SUMMARY

According to an aspect of the present invention, there is provided an input device including: a printing layer on which an image of a key including a character is printed; a 3D lens that three-dimensionally floats the image of the key printed on the printing layer; and an input detector that detects an input in accordance with the depression of the image of the key floating three-dimensionally.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A to 2C are diagrams illustrating examples of an image that is printed on a printing layer;

DESCRIPTION OF EMBODIMENTS

There are a tablet and a mobile phone which output sound and vibration and improve the comfort of the input when the key of the software keyboard is depressed. However, it is difficult for them to provide the comfort of the input at the same level as the mechanical key.

A description will now be given of an embodiment according to the present invention with reference to drawings.

Figure 1A:
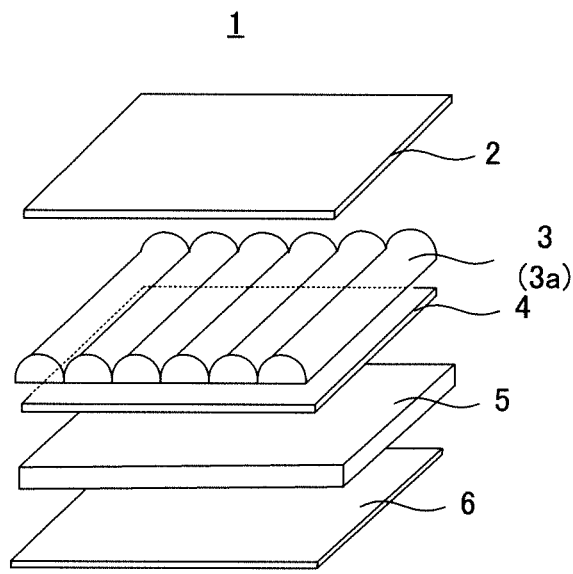
FIG. 1A is an exploded perspective view of an input device according to a present embodiment.
Figure 1B:
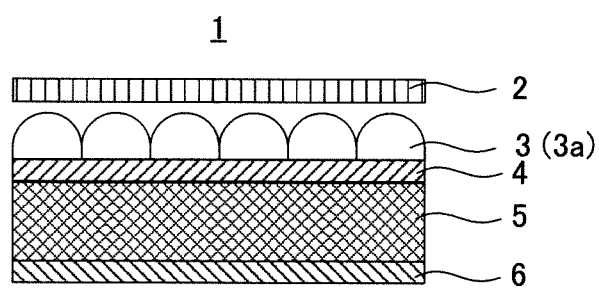
FIG. 1B is a cross-section view of the input device.
Figure 1C:
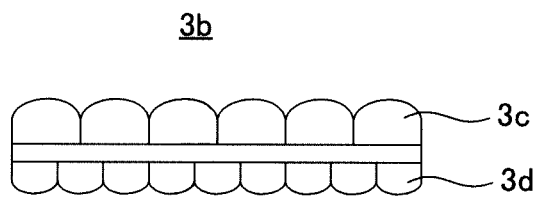
FIG. 1C is a diagram illustrating an example of a microlens array.
Figure 1D:
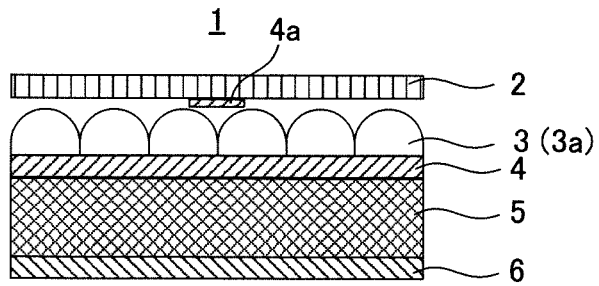
FIG. 1D is a cross-section view illustrating a first variation of the input device.

FIG. 1A is an exploded perspective view of an input device 1 according to a present embodiment. FIG. 1B is a cross-section view of the input device 1. FIG. 1C is a diagram illustrating an example of a microlens array 3b. FIG. 1D is a cross-section view illustrating a first variation of the input device 1.

The input device 1 causes an illusion as if a user is depressing a mechanical key when an image of a key floating three-dimensionally is depressed with a finger. The input device 1 can be mounted on various devices such as tablet terminals, mobile phones, computers, ticket machines and automated teller machines (ATMs).

The input device 1 includes a protective sheet 2, a 3D lens 3, a printing layer 4, a depression feeling imparting member 5 and an input detection unit 6, as illustrated in FIGS. 1A and 1B. The protective sheet 2, the 3D lens 3, the printing layer 4, the depression feeling imparting member 5 and the input detection unit 6 are arranged in this order from above.

The 3D lens 3 is a lenticular lens 3a having semi-cylindrical lenses arranged in a row on an upper side, for example, and forms a stereoscopic image by binocular parallax. In the lenticular lens 3a, there are a plurality of types according to the number of lenses per inch (Line Per Inch). In the lenticular lenses of 100 Lpi, 100 semi-cylindrical lenses per inch are arranged. In the lenticular lenses of 200 Lpi, 200 semi-cylindrical lenses per inch are arranged. The printing layer 4 is formed on a lower surface of the 3D lens 3 by inkjet, screen printing or the like. Keyboard keys or the like including letters, symbols or numbers are printed on the printing layer 4. Hereinafter, the letters, the symbols and the numbers are collectively referred to as "characters".

The microlens array 3b that is a collection of convex lenses as illustrated in FIG. 1C may be used as substitute for the lenticular lens 3a. In the microlens array 3b, convex lenses 3c are arranged on one of an upper surface and a lower surface, and convex lenses 3d each having a smaller diameter than each convex lens 3c are arranged on the other thereof. When the microlens array 3b is used, the printing layer 4 is formed on any one of the upper surface and the lower surface of the microlens array 3b by inkjet or the like.

When the key including the character formed on the printing layer 4 is viewed from the front, the 3D lens 3 including the lenticular lens 3a and the microlens array 3b can make the key float three-dimensionally, that is, can create the illusion as if the key slightly floats (about a few millimeters).

Since the upper surface of the 3D lens 3 has fine unevenness, there is a problem that dirt is easily attached thereto and is hardly wiped therefrom. For this reason, the protective sheet 2 is provided on the lenticular lens 3a and the microlens array 3b.

When the user depresses the image of the key floating three-dimensionally, specifically, when the protective sheet 2 is depressed, the depression feeling imparting member 5 imparts a depression feeling to a user's finger. For example, an urethane cushion, an urethane resin sheet, a shock absorbing gel sheet, a piezo element, an eccentric motor or a vibration actuator is used as the depression feeling imparting member 5. When the urethane cushion, the urethane resin sheet or the shock absorbing gel sheet is used, a repulsive force is imparted to the user in accordance with the depression of the protective sheet 2. The urethane resin sheet and the shock absorbing gel sheet may be transparent or colored. When the piezo element, the eccentric motor or the vibration actuator is used, vibration is generated according to the depression of the protective sheet 2.

The input detection unit 6, for example, is composed of a membrane switch, a touch panel or the like. The input detection unit 6 detects an input in accordance with the depression of the image of the key floating three-dimensionally. When the input detection unit 6 detects the input, the input detection unit 6 outputs an input signal to a CPU, not illustrated.

In the above example, the key of the keyboard including the character is printed on the printing layer 4. However, a character 4a may be printed on the protective sheet 2 and an image of the key may be printed on the printing layer 4, as illustrated in FIG. 1D.

Figure 3:
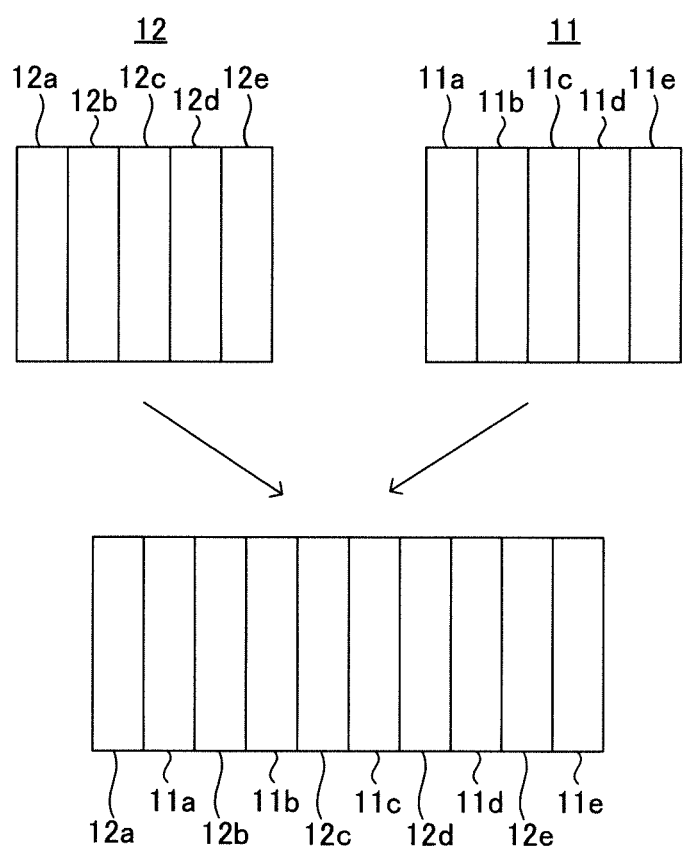
FIG. 3 is a diagram illustrating an example of an image that is printed on the printing layer when a lenticular lens is used.

FIGS. 2A to 2C are diagrams illustrating examples of the image that is printed on the printing layer 4. FIG. 3 is a diagram illustrating an example of the image that is printed on the printing layer 4 when the lenticular lens 3a is used.

When the microlens array 3b is used as the 3D lens 3, the printing layer 4 is composed of a single image of the key including the character as illustrated in FIG. 2A, for example. In FIG. 2A, the character corresponds to "1", and a frame corresponds to the image of the key.

On the other hand, when the lenticular lens 3a is used as the 3D lens 3, the printing layer 4 is composed of a composite image in which a plurality of images of the key including the character are overlapped with each other, as illustrated in FIGS. 2B and 2C, for example. The plurality of images of the key including the character are shifted to each other, and the colors of the images are changed so as to thin the image of an upper side and thicken the image of a lower side. A composite image 9 is generated based on five images in FIG. 2B, and a composite image 10 is generated based on three images in FIG. 2C. However, the number of images to be overlapped is not limited to 3 or 5. Moreover, when the lenticular lens 3a is used as the 3D lens 3, in the printing layer 4, each of a composite image 11 for a right eye and a composite image 12 for a left eye is divided in accordance with the number of lenses per inch included in the lenticular lens 3a as illustrated in FIG. 3. Then, divided composite images 11a-11e for the right eye and divided composite images 12a-12e for the left eye are arranged alternately.

As the number of images to be overlapped which are the material of the composite image increases, the three-dimensional feeling of the key increases. Conversely, as the number of images to be overlapped decreases, the three-dimensional feeling of the key decreases. Therefore, when the composite image 9 of FIG. 2B is viewed via the lenticular lens 3a, the three-dimensional feeling of the key increases, compared to the composite image 10 of FIG. 2C.

When the composite image 9 of FIG. 2B is viewed via the lenticular lens 3a, the character of the key inside a viewing angle looks clear, but the character of the key deviating from the viewing angle looks blurred. Conversely, when the composite image 10 of FIG. 2C is viewed via the lenticular lens 3a, the character of the key inside the viewing angle looks clear, and the character of the key deviating from the viewing angle also looks clear compared to FIG. 2B.

For this reason, when the printing layer 4 is formed with the use of the composite image 9 of FIG. 2B, the keys arranged on a central part of the input device 1 increase three-dimensional feeling and look clear, and the characters of the keys arranged on right and left ends of the input device 1 look blurred. When the printing layer 4 is formed with the use of the composite image 10 of FIG. 2C, the characters of the keys arranged on the central part and the right and left ends of the input device 1 look overall clear, but the three-dimensional feeling thereof decreases.

Therefore, in the central part of the printing layer 4, it is preferable to increase the number of images to be overlapped, compared to the right and left ends of the printing layer 4. In this case, although the three-dimensional feeling of the keys decreases in the right and left ends of the input device 1, the characters of the keys look clearly throughout the whole input device 1. Therefore, it is possible to realize the input device 1 more similar visually to a mechanical keyboard.

When the width of each semi-cylindrical lens of the lenticular lens 3a is wide, i.e., when the number of lenses per inch is small, the key three-dimensional feeling increases, but the character of the key deviating from the viewing angle looks blurred. Conversely, when the width of each semi-cylindrical lens of the lenticular lens 3a is narrow, i.e., when the number of lenses per inch is large, the key three-dimensional feeling decreases, but the character of the key deviating from the viewing angle looks clear, compared to the case where the width of each semi-cylindrical lens is wide.

Figure 4:
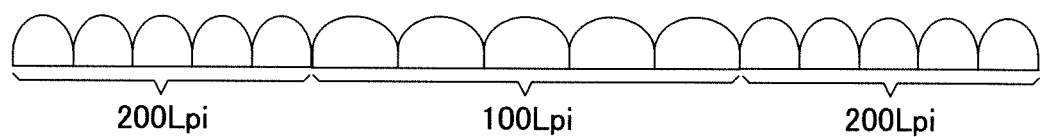
FIG. 4 is a cross-section view illustrating an example of the lenticular lens.

It is therefore preferable that the width of each lens arranged on the central part of the lenticular lens 3a is wider than the width of each lens arranged on the right and left ends thereof, i.e., the number of lenses per inch arranged on the central part of the lenticular lens 3a is less than the number of lenses per inch arranged on the right and left ends thereof. Specifically, the lenticular lens 3a is configured to arrange the lenticular lenses of 200 Lpi on the right and left ends of the lenticular lenses of 100 Lpi, as illustrated in FIG. 4. Thus, although the three-dimensional feeling of the keys decreases in the right and left ends of the input device 1, the characters of the keys look clear throughout the whole input device 1. Therefore, it is possible to realize the input device 1 more similar visually to the mechanical keyboard.

Here, the present embodiment may execute (i) increasing the number of images to be overlapped at the central part of the printing layer 4 than the number of images to be overlapped at the right and left ends of the printing layer 4, and (ii) widening the width of each semi-cylindrical lens arranged on the central part than that of each semi-cylindrical lens arranged on the right and left ends, each independently or at the same time.

Figure 5A:
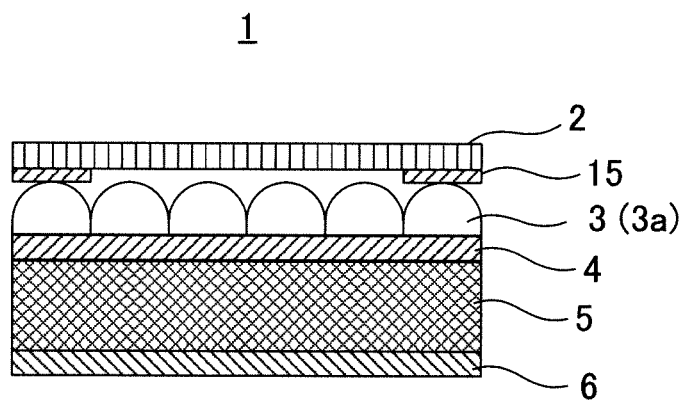
FIG. 5A is a cross-section view illustrating a second variation of the input device.

FIG. 5A is a cross-section view illustrating a second variation of the input device 1. In FIG. 5A, a frame 15 is printed on a lower surface of the protective sheet 2 by inkjet or screen printing. The frame 15 is disposed on an outer edge of the printing layer 4 and between the images of the plurality of keys, for example. When the protective sheet 2 on which the frame 15 is printed and the image of the key on the printing layer 4 are combined, the user feels a boundary between the key floating three-dimensionally and a space between the keys, and it is therefore possible to cause the illusion in which the keys look more three-dimensionally.

Figure 5B:
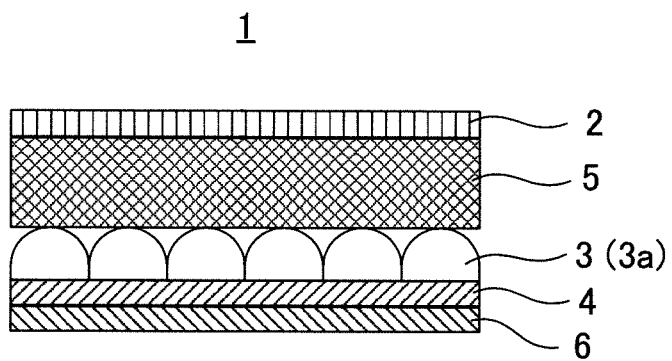
FIG. 5B is a cross-section view illustrating a third variation of the input device.

FIG. 5B is a cross-section view illustrating a third variation of the input device 1. When the depression feeling imparting member 5 is a transparent urethane resin sheet or a transparent shock absorbing gel sheet, the depression feeling imparting member 5 may be disposed between the protective sheet 2 and the 3D lens 3, as illustrated in FIG. 5B. Thus, it is also possible to provide a clear depression feeling to the user.

Figure 6A:
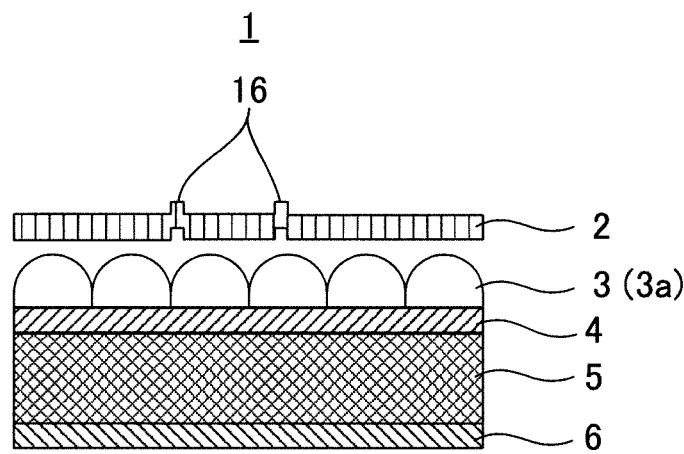
FIG. 6A is a cross-section view illustrating a fourth variation of the input device.
Figure 6B:
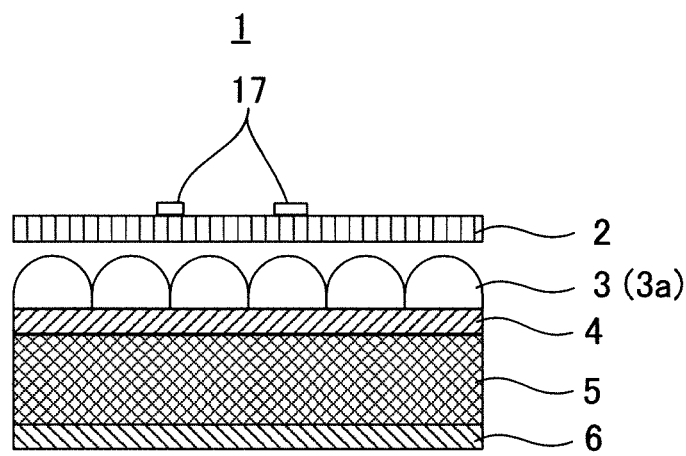
FIG. 6B is a cross-section view illustrating a fifth variation of the input device.

FIG. 6A is a cross-section view illustrating a fourth variation of the input device 1. FIG. 6B is a cross-section view illustrating a fifth variation of the input device 1. The software keyboard which performs an input by touching a flat screen has no home position and no boundary between the keys, which causes touch errors easily.

In FIG. 6A, projections 16 are formed on an upper surface of the protective sheet 2 by embossing. In FIG. 6B, projections 17 are formed on the upper surface of the protective sheet 2 by UV printing. Thus, the projections 16 or 17 are formed on the upper surface of the protective sheet 2, so that the home position and the boundary between the keys are formed. It is therefore possible to facilitate the input.

Figure 6C:
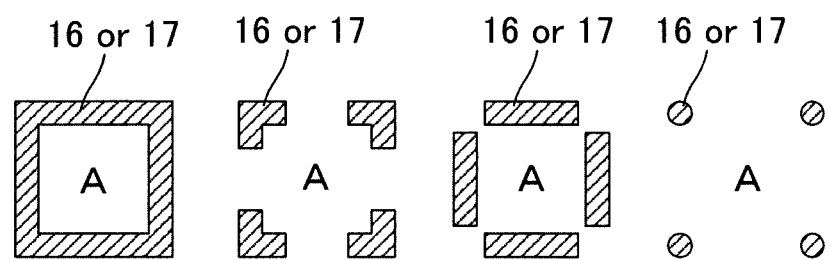
FIG. 6C is a diagram illustrating examples of shapes of projections.

FIG. 6C is a diagram illustrating examples of shapes of the projections 16 or 17. In FIG. 6C, hatched portions surrounding a character "A" indicate the projections 16 or 17. The projections 16 or 17 have a rectangular shape surrounding the character "A", L-shapes to be arranged on four corners of the character "A", bar shapes to be arranged on four sides surrounding the character "A", point shapes to be arranged on the four corners of the character "A", or the like. Here, the shapes of the projections 16 or 17 are not limited to the examples of FIG. 6C. For example, the projection 16 or 17 having a point shape may be formed in the center of the character "A".

Figure 7A:
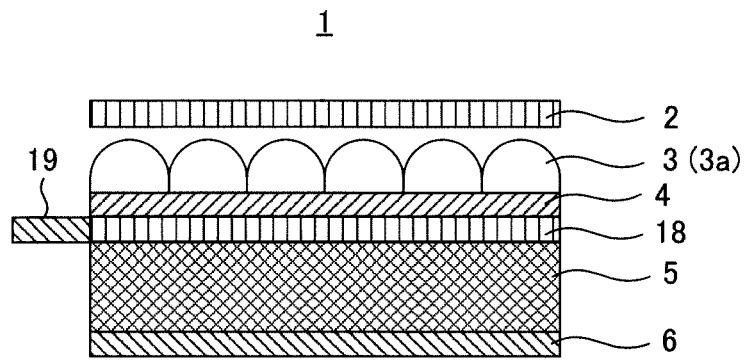
FIG. 7A is a cross-section view illustrating a sixth variation of the input device.
Figure 7B:
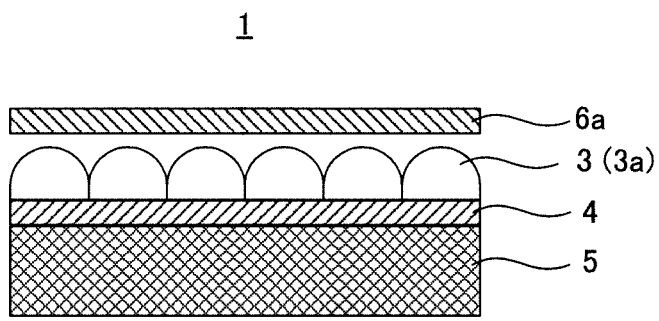
FIG. 7B is a cross-section view illustrating a seventh variation of the input device.
Figure 7C:
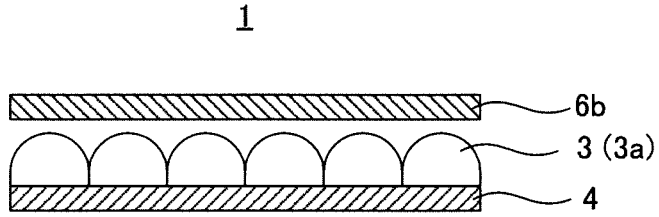
FIG. 7C is a cross-section view illustrating an eighth variation of the input device.

FIG. 7A is a cross-section view illustrating a sixth variation of the input device 1. FIG. 7B is a cross-section view illustrating a seventh variation of the input device 1. FIG. 7C is a cross-section view illustrating an eighth variation of the input device 1.

In FIG. 7A, a light guide plate 18 is disposed between the printing layer 4 and the depression feeling imparting member 5, and an LED light 19 is provided as a light source adjacent to the light guide plate 18. To make the three-dimensional feeling of the keys more feel, it is very important how to attach the shadow. For this reason, a bright part and a dark part are clearly formed by using the light guide plate 18 and the LED light 19, so that it is possible to provide the illusion that the keys are more three-dimensional.

In FIGS. 7B and 7C, the input detection unit 6 is disposed at the top of the input device 1. The input detection unit 6 is composed of a touch panel, for example.

In FIG. 7B, an electrostatic capacitance type touch panel 6a is used as the touch panel. In this case, since the electrostatic capacitance type touch panel 6a does not provide the depression feeling, the depression feeling imparting member 5 is disposed under the printing layer 4.

In FIG. 7C, a resistance film type touch panel 6b is used as the touch panel. In this case, since the resistance film type touch panel 6b has an air layer between upper and lower substrates, the user can feel the depression feeling even without the depression feeling imparting member 5 and it is possible to realize a thinner structure.

Here, in the first to the eighth variations of the input device 1, the lenticular lens 3a is used, but the microlens array 3b may be used as substitute for the lenticular lens 3a.

As described above, in the present embodiment, the input device 1 includes: the printing layer 4 on which the image of the key including the character is printed; the 3D lens 3 that three-dimensionally floats the image of the key printed on the printing layer 4; and the input detection unit 6 that detects an input in accordance with the depression of the image of the key floating three-dimensionally. It is therefore possible to improve the comfort of the input by using visual effects.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:
1. An input device comprising:
a printing layer on which an image of a key including a character is printed;
a 3D lens that three-dimensionally floats the image of the key printed on the printing layer, the 3D lens comprising semi-cylindrical lenses, a density of the semi-cylindrical lenses in a central part of the 3D lens being lower than a density of the semi-cylindrical lenses on side parts of the 3D lens; and
an input detector that detects an input in accordance with the depression of the image of the key floating three-dimensionally.
2. The input device as claimed in claim 1, wherein
the printing layer includes a composite image in which a plurality of images of the key including the character are overlapped with each other, and a central part of the printing layer has a large number of images to be overlapped than right and left ends of the printing layer.
3. The input device as claimed in claim 1, further comprising:
a depression feeling imparting member that imparts a depression feeling to a user's finger.
4. The input device as claimed in claim 1, further comprising:
a protective sheet on the 3D lens.
5. The input device as claimed in claim 4, wherein
a surface of the protective sheet includes one or more projections.

6. The input device as claimed in claim 1, further comprising:
   a light guide plate below the 3D lens; and
   a light source adjacent to the light guide plate.

\* \* \* \* \*